United States Patent
Wu et al.

(10) Patent No.: US 7,323,212 B2
(45) Date of Patent: Jan. 29, 2008

(54) METHOD AND SYSTEM OF CONTROLLING DUMMY DISPENSE

(75) Inventors: Hong-Yi Wu, Hsinchu (TW); Chih-Jung Weng, Hsinchu (TW); Chung-Cheng Ni, Hsinchu (TW); Yi-Hsin Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 537 days.

(21) Appl. No.: 10/696,300

(22) Filed: Oct. 29, 2003

(65) Prior Publication Data

US 2005/0095537 A1  May 5, 2005

(51) Int. Cl.
*C23C 16/52* (2006.01)
(52) U.S. Cl. .......................... 427/8; 427/425; 427/162; 427/240; 118/715
(58) Field of Classification Search .................. 427/8, 427/425, 162, 240; 118/715
See application file for complete search history.

(56) References Cited

U.S. PATENT DOCUMENTS

| 4,644,493 A | 2/1987 | Chandra et al. |
|---|---|---|
| 4,888,692 A | 12/1989 | Gupta et al. |
| 4,903,296 A | 2/1990 | Chandra et al. |
| 5,260,868 A | 11/1993 | Gupta et al. |
| 5,442,561 A | 8/1995 | Yoshizawa et al. |
| 5,630,070 A | 5/1997 | Dietrich et al. |
| 5,832,088 A | 11/1998 | Nakajima et al. |
| 5,912,054 A * | 6/1999 | Tateyama .................... 427/425 |
| 6,083,667 A | 7/2000 | Nishizawa et al. |
| 6,268,013 B1 * | 7/2001 | Akimoto et al. ................ 427/8 |
| 6,740,296 B1 * | 5/2004 | Inoue .......................... 422/106 |
| 2003/0059534 A1 * | 3/2003 | Nishijima et al. ........... 427/240 |
| 2004/0069226 A1 * | 4/2004 | Yoshida et al. .............. 118/715 |

* cited by examiner

*Primary Examiner*—Alain L. Bashore
(74) *Attorney, Agent, or Firm*—Duane Morris LLP

(57) ABSTRACT

A dummy dispense of liquid is controlled by recording a time at which a substrate is processed; recording a time at which a liquid is dispensed; comparing the time at which the substrate is processed and the time at which the liquid is dispensed to generate a dummy dispense signal when a dummy dispense is required. A system for controlling dummy dispense of liquid includes at least one information storage device storing a time at which a substrate is processed and a time at which a liquid is dispensed. At least one processor compares the time at which the substrate is processed and the time at which the liquid is dispensed to determine whether a dummy dispense is required.

3 Claims, 4 Drawing Sheets

METHOD AND SYSTEM OF CONTROLLING DUMMY DISPENSE

BACKGROUND

The present invention relates to a method or a system for fabrication of semiconductor integrated circuits; more particularly, the present invention relates to a method and a system for controlling dummy dispense of a liquid within fabrication of semiconductor integrated circuits.

Photolithography is an essential part in semiconductor fabrication. Usually, it includes the following steps: coating of a photoresist layer, exposure to a light source, and developing by developer. When the photoresist layer is irradiated by a light source, the irradiated photoresist will transform to, or generate acid. After contacting with a developer, usually an alkali solution, the irradiated photoresist reacts with the developer, but the non-irradiated portion does not. Therefore, a positive or negative image of a mask is transformed on the substrate.

When sub-micron or deep sub-micron technologies are generally used within semiconductor integrated circuits, the photoresist coating process is more important and difficult to control. Usually, a tracker for a photoresist coating has two or more different photoresists responding to different photoresist coating recipes. The different photoresists in the tracker are conveyed separately to different nozzles by conduits to avoid contamination. Because of the mass production of semiconductor integrated circuits, one of the photoresists in a tracker usually runs out sooner than the others. Under this situation, some photoresists may not be used for a particular period of time. Because the photoresist is a volatile solution, the solvent of the photoresist tends to evaporate when the photoresist is exposed to air. As a result, the nozzle becomes clogged by photoresist due to the evaporation of the solvent when the photoresist is not used. If the clogged nozzle dispenses photoresist on a silicon wafer, poor wafer coating frequently occurs and leads to rework of the photolithographic process, or low yield of the product. In order to avoid nozzle clogging, the conventional method has two approaches. First, a dummy dispense is performed. The time to perform each dummy dispense is set to reoccur as time passes. For example, a dummy dispense depends on different settings to reoccur corresponding to different liquids. Second, a dummy dispense is performed prior to coating a photoresist layer on the first wafer of each lot.

FIG. 1 shows a result generated from a traditional technique used to control dummy dispense within fabrication of semiconductor integrated circuits. Usually, it takes 30 minutes for coating a photoresist layer on a manufacturing lot of wafers, for example, 24 pieces during a photoresist coating process. In a continuous photoresist coating process, four lots of wafers can be processed in 2 hours. Based on traditional approaches, six dummy dispenses are required in two hours. However, most of the dummy dispenses are not necessary when the photoresist coating process for different lots is continuous. For example, the second to the sixth dummy dispenses are not required when the nozzle does not become clogged in the continuous photoresist coating process. Accordingly, the conventional dummy-dispense process will increase the cost of fabricating semiconductor integrated circuits due to the unnecessary dummy dispenses.

Accordingly, it is desirable to provide a method and a control system to reduce the manufacturing cost and improve productivity as well.

SUMMARY

A method for controlling the dummy dispense of liquid is disclosed. The method includes the steps of: recording a time at which a substrate is processed; recording a time at which a liquid is dispensed; comparing the time at which the substrate is processed and the time at which the liquid is dispensed to determine whether a dummy dispense is required; and generating a dummy dispense signal when the dummy dispense is required.

A system for controlling dummy dispense of liquid is also disclosed. The system includes at least one information storage means adapted to record a time at which a substrate is processed and a time at which a liquid is dispensed. At least one processor is coupled to the at least one information storage means, adapted to compare the time at which the substrate is processed and the time at which the liquid is dispensed to determine whether a dummy dispense is required. A dispensing system is coupled to the at least one processor.

DETAILED DESCRIPTION

Figure 1:
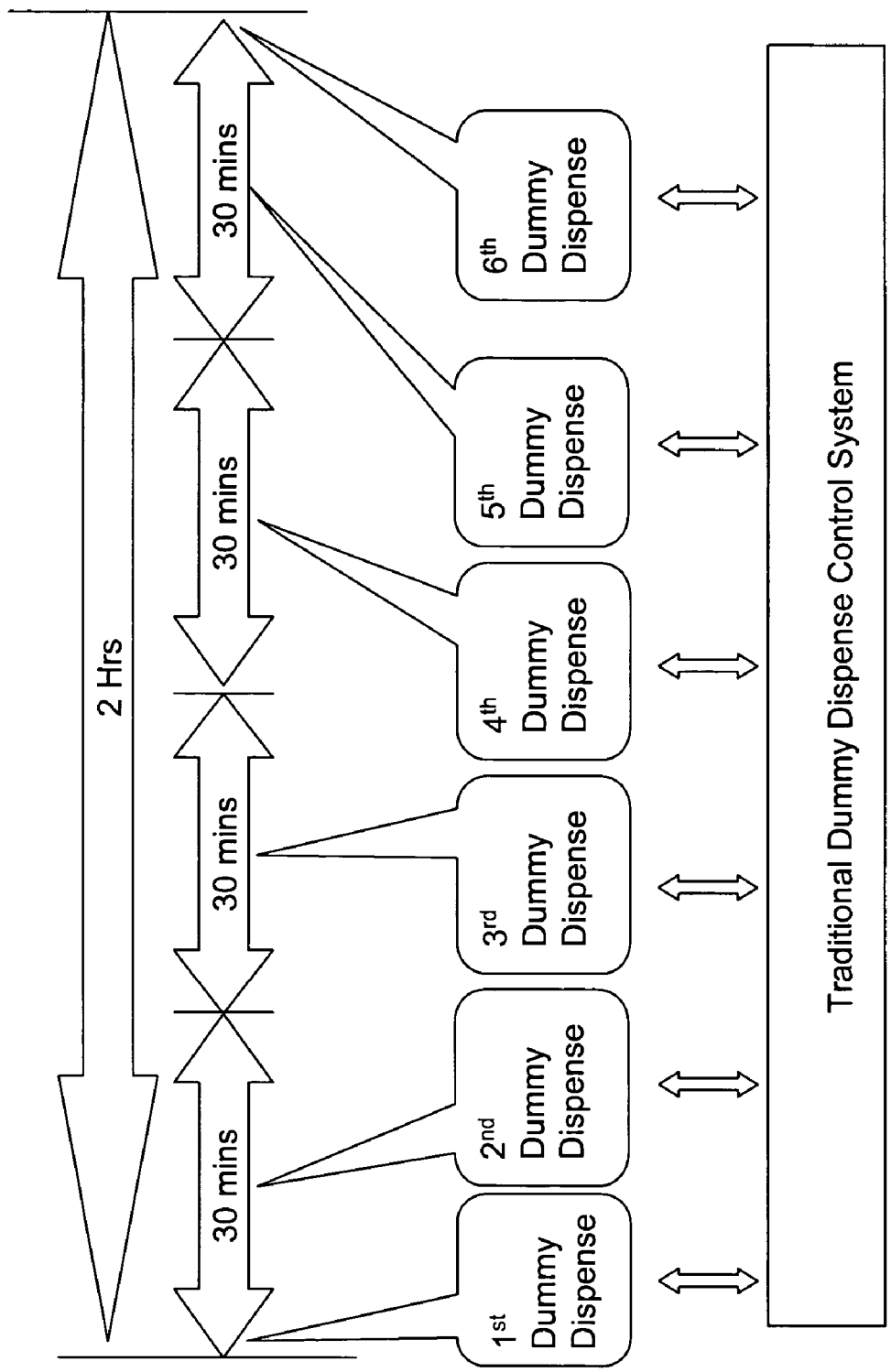
FIG. 1 illustrates a result generated from a conventional approach of controlling dummy dispense of photoresist.
Figure 2:
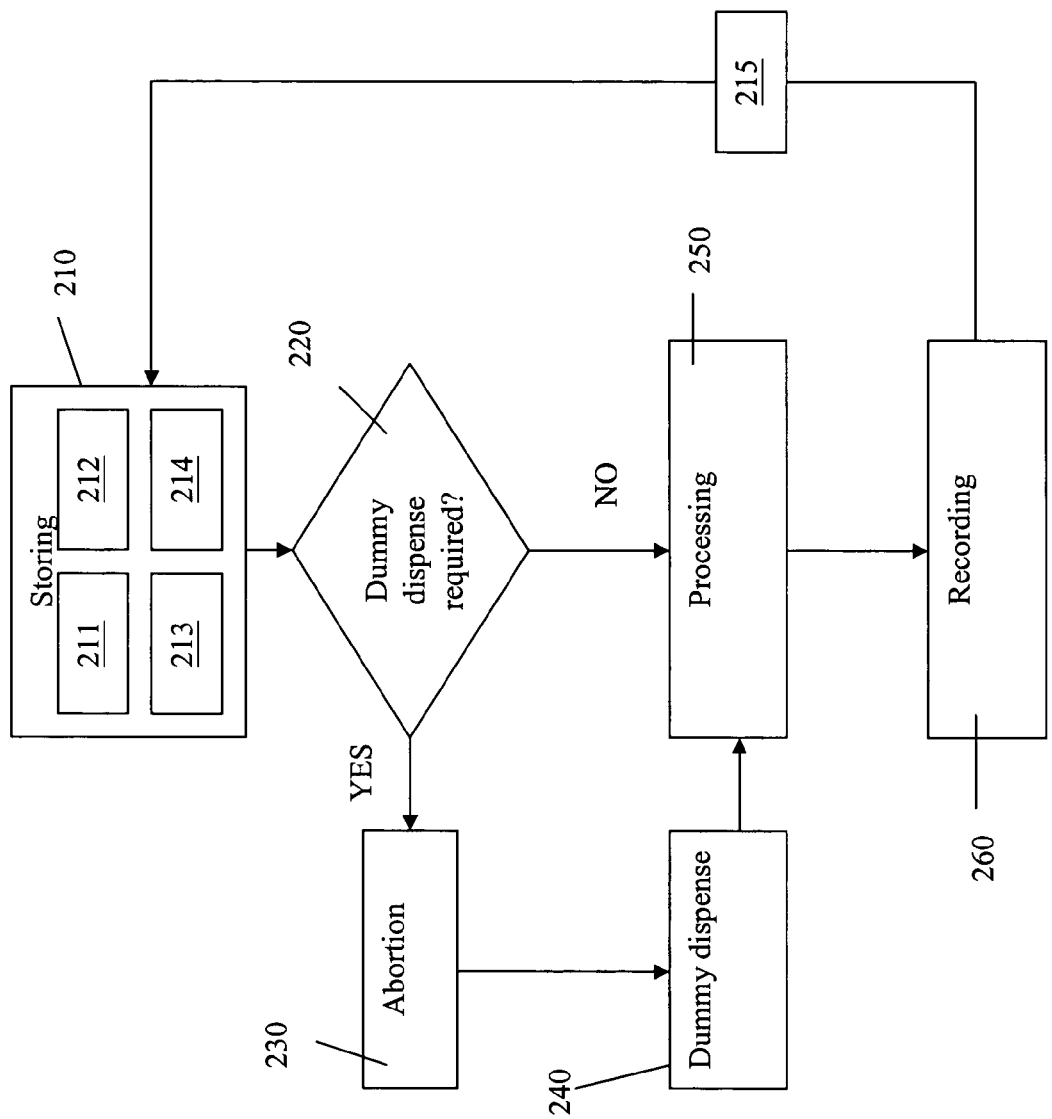
FIG. 2 illustrates a flowchart showing an exemplary method for controlling dummy dispense in accordance with the present invention.

FIG. 2 illustrates a flowchart of an exemplary method for controlling dummy dispense in accordance with the invention. In these embodiments shown in FIG. 2, the method includes a storing step 210, a comparing step 220, an abortion step 230, a dummy dispense step 240, a processing step 250, and a recording step 260.

The storing step 210 is adapted to record a time 211 at which a substrate is processed and a time 212 at which a liquid is dispensed. In some embodiments, the storing step further records a recipe 213 for dispensing the liquid and the name 214 of the liquid.

The time 211 at which the substrate is processed can be, for example, a time within any process at which the substrate is processed, such as move-in time or move-out time of the substrate for any fabrication process. The substrate can be, for example, a semiconductor wafer substrate, a liquid crystal display substrate (TFT LCD, TN LCD, STN LCD) or any other substrate, such as an electro luminescence (EL) display. In some embodiments, the substrate is a semiconductor wafer, for example, a silicon substrate, silicon-germanium substrate, silicon-on-insulator (SOI) substrate, or III-V compound substrate or any other substrate that semiconductor integrated circuits can be formed thereupon.

The time 212 at which the liquid is dispensed can be, for example, the last time at which the liquid is dispensed for the dummy dispense or process dispense. In some embodiments, the liquid is a volatile solution, such as photoresist, polyimide, anti-reflection coating (ARC) material or spin-on dielectric (SOD) material. Generally, the liquid will be dispensed by a nozzle. When the liquid is not dispensed for a period of time, the nozzle head becomes clogged by the solute of the liquid. In some embodiments, photoresist is used to be coated on a silicon wafer. Because photoresist is a volatile solution, the solvent of the photoresist will evaporate after the photoresist is exposed to air for a period of time, e.g., 15 minutes. One of ordinary skill in the art will appreciate that evaporation of solvent depends on the liquid property and how long the liquid is exposed to air. Therefore, in some embodiments, the use of non-volatile solutions results in the same situation, as if generated from volatile solutions when the non-volatile solutions are exposed to air for a long enough period of time.

The comparing step 220 is adapted to compare, for example, the time 211 at which the substrate is processed and the time 212 at which the liquid is dispensed, and determine whether a dummy dispense is required.

In the comparing step 220, the time 211 at which the substrate is processed and the time 212 at which the liquid is dispensed are compared. In these embodiments using a move-in time of a substrate and a last time at which a liquid is dispensed, the comparing step 220 generates a time difference between the move-in time of the substrate and the last time at which the liquid is dispensed. In these embodiments, the comparing step 220 further determines whether the time difference between the move-in time of the substrate and the last time at which the liquid is dispensed is larger than, or equal to, a period of time that is long enough to cause substantial evaporation of the solvent of the liquid. Therefore, the comparing step 220 determines whether a dummy dispense of the liquid is required. In one embodiment, the period of time can be larger than about 15 minutes. As mentioned above, different liquids have different evaporation rate. One of ordinary skill in the art will appreciate that a suitable time period for the dummy dispense depends on the quality or material property of the liquid, such as the evaporation rate of solvents of the liquids.

In some embodiments, the storing step 210 further comprises recording the recipe 213 for determining identification or the name 214 of the liquid, in response to the recipe 213. The recipe 213 includes, for example, process parameters for controlling a dispensing or coating process, or recipe name, which can identify the recipe 213. The identification or name 214 of the liquid can be, for example, a real name of the liquid, a pseudo-name of the liquid, a number, or any other identification approaches that can identify the liquid. In these embodiments, the comparing step 220 further determines whether the name 214 of the liquid responds to the recipe 213 for the system to know which liquid's last dispense time 212 to use. By the comparing step 220, a liquid that should be used in the process can be identified and correctly used. For example, two or three types of photoresists are stored in a tracker. By checking the photoresist name and the recipe for processing the wafer, "miss-operations" of the photoresist coating can be avoided. However, determining whether the name 214 of the liquid responds to the recipe 213 is not necessarily required if, for example, only one liquid is equipped in the tool, equipment or tracker. Therefore, one of ordinary skill in the art will appreciate that determining whether the name of the liquid responds to the recipe for dispensing the liquid is optional.

The abortion step 230 is adapted to hold the substrate from being coated with the liquid unless a dummy dispense is performed. As mentioned above, when the time difference between the move-in time of the substrate and the last time at which the liquid is dispensed is larger than, or equal to, a period of time that is long enough to make the solvent of the liquid substantially evaporate, a dummy dispense is required. The abortion step 230 will hold the substrate from being coated with the liquid until the dummy dispense step 240 is performed. The dummy dispense step 240 is adapted to perform a dummy dispense and clean a nozzle head for dispensing the liquid.

However, in accordance with the comparing step 220, if the time difference between the move-in time of the substrate and the last time at which the liquid is dispensed is smaller than the time period set for dummy dispense, a dummy dispense is not required. The substrate then goes to the processing step 250 directly, bypassing the abortion step 230 and the dummy dispense step 240.

The processing step 250 is adapted to normally coat or dispense a liquid on a substrate. After waiting for execution of the dummy dispense step 240, the processing step 250 coats or dispenses the liquid on the substrate.

Following the processing step 250, the recording step 260 is adapted to record an updated time 215 at which the liquid is dispensed. When the processing step 250 is performed, the updated time 215 at which the liquid is dispensed is recorded by the recording step 260. In these embodiments shown in FIG. 2, the updated time 215 is fed back to the storing step 210 for a subsequent process.

Figure 3:
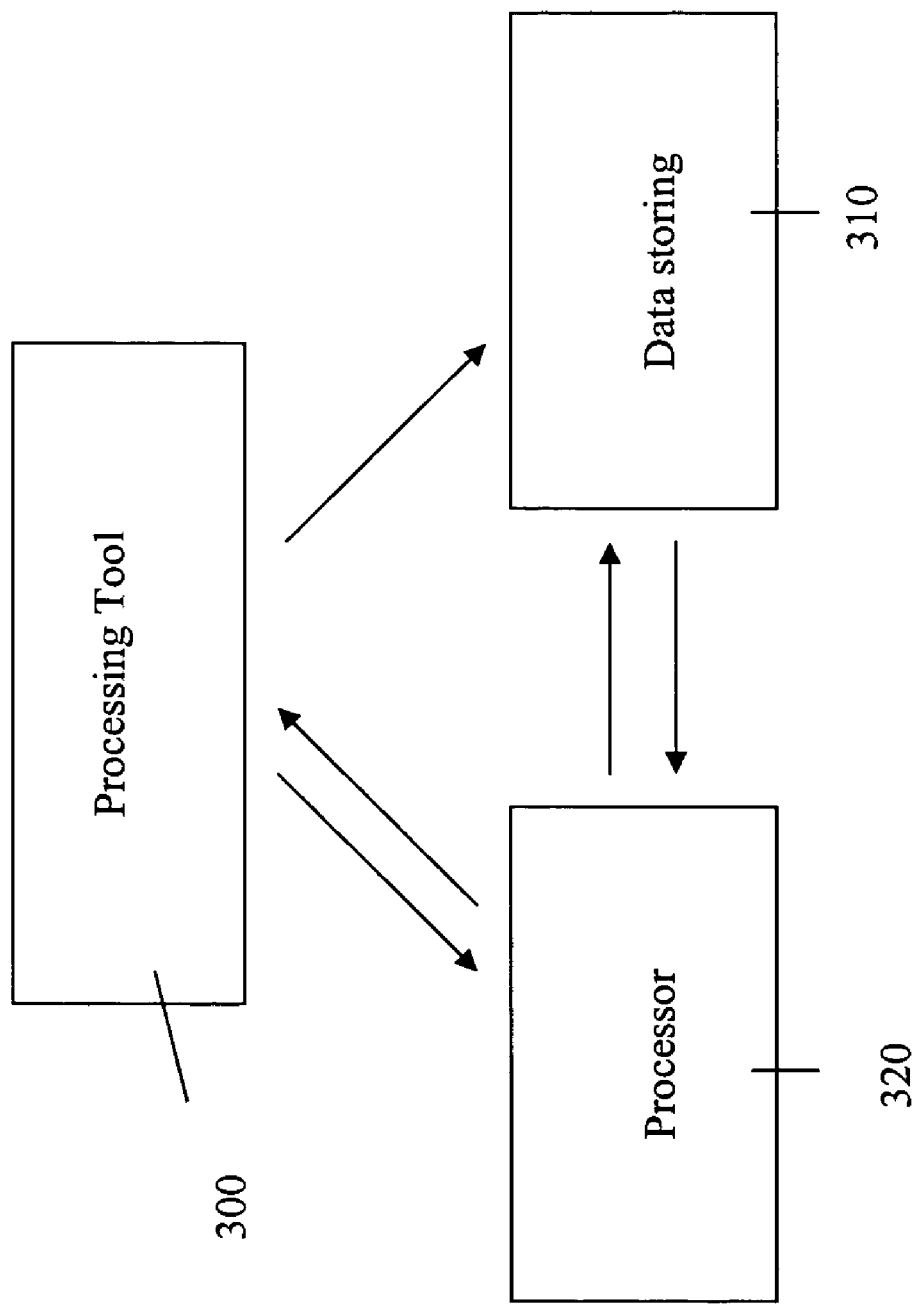
FIG. 3 illustrates an exemplary system for controlling dummy dispense in accordance with the present invention.

FIG. 3 illustrates an exemplary system for controlling the dummy dispense during a manufacturing process. The system includes a dispensing system 300 (named "processing tool" in FIG. 3), a processor 320, and a information storage means 310. In the embodiments shown in FIG. 3, they are coupled to each other.

The dispensing system 300 can be, for example, a liquid dispenser, a photoresist tracker or any other tool that is equipped with a nozzle for dispensing a liquid. As mentioned in FIG. 2, the liquid can be a volatile solution, such as photoresist, polyimide or anti-reflection coating (ARC) material.

The information storage means 310 is adapted to collect a time 211 at which a substrate is processed, a time 212 at which a liquid is dispensed, a recipe 213 for dispensing the liquid, the name 214 of the liquid and an updated time 215 of dispensing the liquid. The time 211 at which the substrate is processed includes, for example, a move-time of the substrate. The time 212 at which the liquid is dispensed includes, for example, the last time 212 at which the liquid is dispensed. These items are the same items described in FIG. 2. The information storage means 310 can be tangible media, such as floppy diskettes, read only memories (ROMs), CD-ROMs, hard drives, ZIP™ disks, memory sticks, or any other computer-readable storage medium. There is no requirement that the time 211 at which the substrate is processed, the time 212 at which a liquid is dispensed, a recipe 213 for dispensing the liquid, the name 214 of the liquid and the updated time 215 of dispensing the liquid be stored in the same information storage means. One of ordinary skill in the art will appreciate that whether these items should be stored in the same information storage means depends on the efficiency of the system and the complexity of combining the information in the same information storage means. Therefore, these items can be stored separately in different information storage means, or two or more of them may be stored together.

The processor 320 is adapted to compare the time 211 at which the substrate is processed and the time 212 at which the liquid is dispensed. The processor 310 can be a digital signal processor, a central processing unit (CPU), a computer, a workstation or any other similar signal processor that can substantially perform the same function of the processor 310.

In some embodiments, the processor 320 can further perform the function of the comparing step 220 mentioned in FIG. 2, for example, generating the time difference between the move-in time and the last time at which the liquid is dispensed, determining whether the name 214 of the liquid responds to the recipe 213, or determining whether the time difference is larger than, or equal to, the period of time that is long enough to substantially make the solvent of the liquid evaporate. In some embodiments, the processor 320 also generates a signal to the dispensing system 300 for performing a dummy dispense when the time difference is larger than, or equal to, the period of time set for the dummy dispense. The dispensing system 300 then holds the substrate from processing, while the dummy dispense step 240 is performed first.

After the dummy dispense step 240 is applied, the dispensing system 300 can send a reply signal to the processor 320. The processor 320 can also generate another signal to the dispensing system 300 for processing the substrate. However, there is no requirement that the dispensing system 300 reply to a signal to the processor 320 if the dispensing system 300 can process the substrate automatically after a dummy dispense is performed. Therefore, one of ordinary skill in the art will understand that the response of the dispensing system 300 depends on the structure of the dummy dispense controlling system. Accordingly, if the process is automatically performed after a dummy dispense is applied, the processor 320 does not need to generate and send another signal to the dispensing system 300.

According to another embodiment of the invention, a single processor 320 controls the dispense of a single liquid, and stores the last previous dispense time in the storing means. Multiple processors 320 control the dispense of respective multiple liquids. Thus, each processor 320 stores the last previous dispense time for comparison with the time for when a dummy dispense is needed for the single liquid to avoid nozzle clogging. Storing the recipe name, the move in time, and/or the liquid identification is not needed. Each processor 320, when commanded to perform a dummy dispense, compares the command with the last previous dispense time to determine whether the command is unnecessary or whether to execute a dummy dispense in response to the command. The command is supplied by an operator, or, the command is signaled by each beginning process for a new manufacturing lot.

After the process is finished, the dispensing system 300 sends a signal related to the updated time 215 at which the liquid is dispensed during the process to the information storage means 310.

All the functions performed by the processor 320 are not necessarily to be implemented in the same processor. These functions also can be performed separately and selectively implemented in more than one processor. One of ordinary skill in the art will appreciate that whether performing these functions in the same processor depends on efficiency of the system and the complexity of connection of different processors.

Although the dispensing system 300, the information storage means 310 and the processor 320 are separately illustrated in FIG. 3, it is possible that two or three of the elements can be combined or connected in one system. For example, the information storage means 310 and the processor 320 can be embedded in the dispensing system 300; therefore, the operation efficiency of the system can be improved. Accordingly, one of ordinary skill in the art will appreciate that whether these elements should be combined in the same tool depends on the operation efficiency of the system and the complexity of connection of the different elements. In the embodiment shown in FIG. 3, the dispensing system 300, the information storage means 310 and the processor 320 can be assembled in an equipment, such as CLEAN TRACK ACT-8 or CLEAN TRACK ACT-12 by Tokyo Electron Corp.

Figure 4:
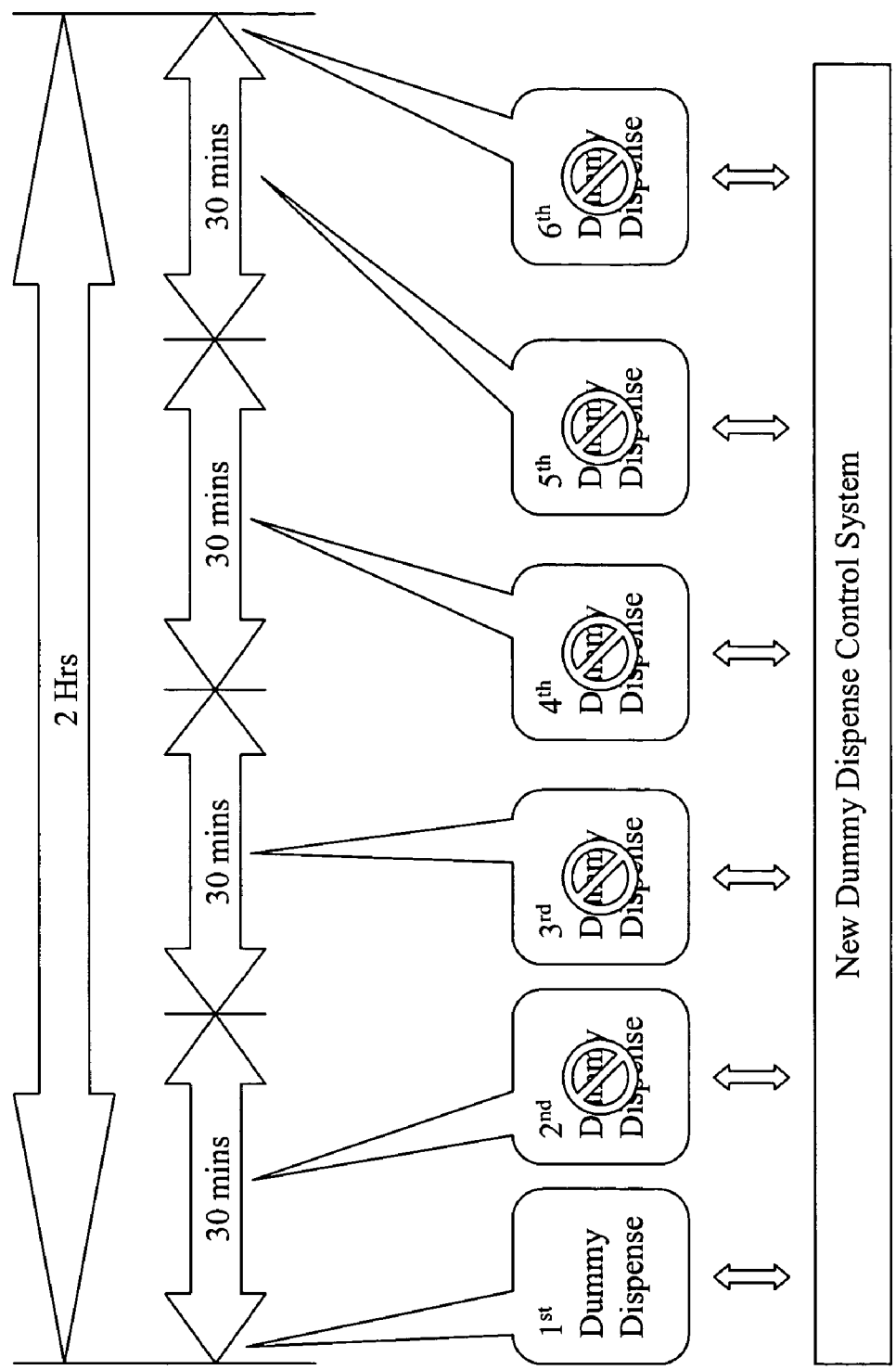
FIG. 4 illustrates the result generated from an exemplary embodiment in accordance with the present invention.

FIG. 4 illustrates the result of an exemplary embodiment in accordance with the method or system disclosed in FIGS. 2 and 3. During a continuous two-hour coating process, only one dummy dispense at the beginning of processing is required in accordance the exemplary method or system mentioned above, instead of six dummy dispenses performed by the traditional controlling system or method. Therefore, the exemplary embodiments can reduce fabrication cost of semiconductor integrated circuits.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. In the fabrication of semiconductor integrated circuits, a method for generating a dummy dispense signal, comprising:
    (a) recording a time at which a substrate is processed;
    (b) recording a time at which a volatile solution is dispensed, wherein the time at which the volatile solution is dispensed comprises a last time at which the volatile solution is dispensed;
    (c) generating a time difference between a move-in time of the substrate and the last time at which the volatile solution is dispensed;
    (d) generating a dummy dispense signal when required,
    (e) recording a recipe for dispensing the volatile solution and a name of the volatile solution,
    (f) performing a dummy dispense when the time difference is larger than, or equal to, a period of time that is long enough to substantially make a solvent of the volatile solution evaporate; and
    (g) determining whether the name of the volatile solution responds to the recipe, wherein the volatile solution is photoresist.

2. The method of claim 1 further comprising dispensing the volatile solution on the substrate.

3. The method of claim 2 further comprising recording an updated time at which the volatile solution is dispensed.

* * * * *